(12) United States Patent
Yamamoto

(10) Patent No.: US 7,455,095 B2
(45) Date of Patent: Nov. 25, 2008

(54) PROTECTIVE TAPE SEPARATION METHOD, AND APPARATUS USING THE SAME

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 577 days.

(21) Appl. No.: 11/195,788

(22) Filed: Aug. 3, 2005

(65) Prior Publication Data
US 2006/0068524 A1 Mar. 30, 2006

(30) Foreign Application Priority Data
Sep. 30, 2004 (JP) ............................. 2004-287696

(51) Int. Cl.
B32B 38/10 (2006.01)
B32B 37/26 (2006.01)
(52) U.S. Cl. .................. 156/537; 156/247; 156/289; 156/344; 156/584
(58) Field of Classification Search ................ 156/247, 156/289, 344, 537, 578, 584
See application file for complete search history.

(56) References Cited
U.S. PATENT DOCUMENTS

| | | | | |
|---|---|---|---|---|
| 5,009,735 A | * | 4/1991 | Ametani et al. | 156/241 |
| 5,891,298 A | * | 4/1999 | Kuroda et al. | 156/344 |
| 6,716,295 B2 | * | 4/2004 | Yamamoto | 156/247 |
| 7,172,673 B2 | * | 2/2007 | Kurosawa et al. | 156/344 |
| 2007/0119543 A1 | * | 5/2007 | Ametani | 156/344 |
| 2007/0169895 A1 | * | 7/2007 | Kobayashi et al. | 156/584 |
| 2007/0235131 A1 | * | 10/2007 | Tsujimoto et al. | 156/344 |

FOREIGN PATENT DOCUMENTS

WO WO-97/08745 A1 3/1997

* cited by examiner

Primary Examiner—Mark A Osele
(74) Attorney, Agent, or Firm—Cheng Law Group PLLC

(57) ABSTRACT

The invention relates to an apparatus for separating a protective tape joined to a semiconductor wafer. Before joining a separation tape to a protective tape on a surface of a semiconductor wafer held, from its back side, by a ring frame via a dicing tape while pressing the separation tape against the protective tape with the use of an edge member, pure water is dropped from a piston nozzle onto the back side of the dicing tape located in front of a joining start end of the separation tape.

7 Claims, 7 Drawing Sheets

PROTECTIVE TAPE SEPARATION METHOD, AND APPARATUS USING THE SAME

BACKGROUND OF THE INVENTION (1) Field of the Invention

The invention relates to a protective tape separation method capable of joining an adhesive tape to a protective tape joined to the surface of a semiconductor wafer held by a ring-shaped frame via a supporting adhesive tape and separating the protective tape integrally with the adhesive tape from the semiconductor wafer with high precision, and to an apparatus using the same.

(2) Description of the Related Art

A semiconductor wafer (hereinafter, simply referred to as "wafer") is thinned by processing the back side of the wafer by using a mechanical method such as grinding or polishing or a chemical method using etching. At the time of processing the wafer by using any of the methods, a protective tape is joined to the surface of the wafer to protect the surface on which a wiring pattern is formed. The back side of the wafer to which the protective tape is joined and which is polished is suction-held by a ring-shaped frame via a supporting adhesive tape. After that, the protective tape is separated from the surface of the wafer held on the ring-shaped frame for removal.

Concretely, the adhesive tape is joined to the surface of the protective tape by a roller and is separated to separate and remove the adhesive tape integrally with the protective tape from the surface of the wafer, and the adhesive tape and the protective tape are taken up. At the time of joining the adhesive tape to the surface of the protective tape, a non-adhesive thin plate is joined to a supporting adhesive tape on the joining start end side so as to prevent contact between the supporting adhesive tape on the joining start end side of the adhesive tape and the adhesive tape wrapped around a roller (refer to, for example, International Patent Publication WO97/08745).

The conventional protective tape separation method, however, has the following problems.

In recent years, with rapid progress in applications, reduction in thickness of a wafer is in demand and a wafer is thinned to 150 μm or less. In the case of holding a wafer W thinned in a state where a protective tape is joined to the wafer W by a supporting adhesive sheet DT from the back side of a ring-shaped frame f and separating the protective tape from the surface of the wafer, when a non-adhesive thin plate thicker than the wafer is joined to the supporting adhesive tape on the joining start end side of the adhesive tape, a gap G generates due to the difference between the thickness of the wafer and the thickness of a thin plate 61 as shown in FIG. 1. Consequently, pressure on the adhesive tape Ts with a roller 60 is uneven due to the gap G. The adhesive tape Ts is not firmly made close-contact with the end of a protective tape PT particularly at the joining start end due to the gap G. It causes a problem in that separation stability is low at the time of separating the adhesive tape Ts integrally with the protective tape PT.

The adhesive tape Ts can be joined to the surface of the protective tape PT uniformly from an end if the non-adhesive thin plate 61 is processed to be thinner than the wafer. There are, however, problems in that it is more difficult to adjust the thickness by coating the surface of a plate member with a non-adhesive material than thinning of the wafer W, and handling for joining the thin plate 61 to the supporting adhesive tape DT in a series of processes of a wafer is difficult.

SUMMARY OF THE INVENTION

The invention has been achieved in view of the above circumstances, and a main object of the invention is to provide a protective tape separation method capable of joining an adhesive tape to a protective tape joined to the surface of a semiconductor wafer held by a ring-shaped frame via a supporting adhesive tape, and separating the adhesive tape, thereby separating the protective tape integrally with the adhesive tape from the semiconductor wafer with high precision, and to an apparatus using the method.

In order to achieve the above object, the invention employs the following configuration.

A method for separating a protective tape from a semiconductor wafer with the protective tape held, from its back side, by a ring-shaped frame via a supporting adhesive tape, the method comprising the steps of:

dropping a liquid material from dropping means at least onto an adhesion surface of the supporting adhesive tape at a joining start end side of a separative adhesive tape; and joining a non-adhesion surface of the separative adhesive tape to the protective tape joined to the semiconductor wafer by a joining member so as to press the non-adhesion surface against the protective tape after the liquid material is dropped onto the adhesion surface of the supporting adhesive tape, and integrally separating the separative adhesive tape and the protective tape from the surface of the semiconductor wafer by separating means.

At the time of joining the separative adhesive tape to the surface of the protective tape while pressing the separative adhesive tape by the joining member, the level of the separative adhesive tape is lower than the thickness (height) of the semiconductor wafer and the protective tape at a joining start end side of the separative adhesive tape. If the semiconductor wafer is thinned to, for example, 150 μm or less, there is a possibility that the separative adhesive tape comes into contact with the adhesion surface of the supporting adhesive tape when a joining operation starts. With method according to the invention, since the liquid material is dropped onto the adhesion surface of the supporting adhesive tape on the joining start end side of the separative adhesive tape, direct contact between the separative adhesive tape and the supporting adhesive tape can be avoided. That is, the separative adhesive tape can be tightly joined to the surface of the protective tape with a uniform press force from an end of the semiconductor wafer. As a result, the protective tape and the separative adhesive tape can be integrally separated with reliability from an end of the semiconductor wafer.

Preferably, the liquid material dropped onto the adhesion surface of the supporting adhesive tape is, for example, pure water or alcohol. The amount of pure water to be dropped is small and naturally evaporates from the back side of the supporting adhesive tape. Even in the case where the pure water does not evaporate all and remains, since the pure water is also used at the time of dicing in a post process, no adverse influence is exerted to the semiconductor wafer.

In order to achieve the above object, the invention also employs the following configuration.

A method for separating a protective tape from a semiconductor wafer with the protective tape held, from its back side, by a ring-shaped frame via a supporting adhesive tape, the method comprising the steps of:

holding the semiconductor wafer by holding means with a protective tape adhesion surface facing downward;

supplying a separative adhesive tape from separative adhesive tape supplying means with an adhesion surface facing upward so as to face the surface of the protective tape;

dropping a liquid material from dropping means onto an adhesion surface on a joining start end side of the separative adhesive tape supplied so as to face the protective tape; and joining a non-adhesion surface of the separative adhesive tape to the protective tape joined to the semiconductor wafer by a joining member so as to press the non-adhesion surface against the protective tape after the liquid material is dropped onto the adhesion surface of the supporting adhesive tape, and integrally separating the separative adhesive tape and the protective tape from the surface of the semiconductor wafer by separating means.

In this method, preferably, the liquid material is a liquid material which has viscosity capable of maintaining a stationary state on the adhesion surface or a liquid material which is constituted by fine particles.

In order to achieve the above object, the invention also employs the following configuration.

An apparatus for separating a protective tape from a semiconductor wafer with the protective tape held, from its back side, by a ring-shaped frame via a supporting adhesive tape, the apparatus comprising:

holding means for mounting and holding thereon the semiconductor wafer held by the ring-shaped frame;

separative adhesive tape supplying means for supplying a separative adhesive tape toward the semiconductor wafer held by the holding means;

separating means for joining the separative adhesive tape to the surface of the protective tape and integrally separating the separative adhesive tape and the protective tape from the surface of the semiconductor wafer by horizontally moving the holding means on which the semiconductor wafer is mounted and held and a joining member for pressing a non-adhesion surface of the separative adhesive tape relative to each other;

dropping means for dropping a liquid material onto an adhesion surface of the supporting adhesive tape on a joining start end side of the separative adhesive tape before the separative adhesive tape is joined; and tape collecting means for collecting the protective tape integrated with the separated separative adhesive tape.

With this apparatus according to the invention, before the separative adhesive tape is joined to the surface of the protective tape, the liquid material is dropped by the dropping means onto the back side of the supporting adhesive tape on the joining start end side. After that, the separative adhesive tape is joined from an end of the protective tape while being pressed by the joining member. Consequently, at the time of joining the separative adhesive tape, by the liquid material dropped onto the adhesion surface of the supporting adhesive sheet on the joining start end side, the separative adhesive tape can be prevented from coming into contact with the supporting adhesive tape. That is, the separative adhesive tape can be tightly joined to the surface of the protective tape with a uniform press force from the end of the semiconductor wafer. As a result, the protective tape and the separative adhesive tape can be integrally separated from the end of the semiconductor wafer with reliability.

Preferably, the dropping means is disposed at a predetermined interval to the front side in the travel direction of the joining member and moves integrally with the joining member horizontally relative to the holding means. With this configuration, the liquid material can be easily dropped onto the adhesion surface of the supporting adhesive sheet on the joining start end side in the series of processes of separating the protective tape, so that the work efficiency can be also improved.

As the dropping means, for example, a nozzle is used. As the joining member, for example, an edge member or a roller is used.

In order to achieve the above object, the invention also employs the following configuration.

An apparatus for separating a protective tape from a semiconductor wafer with the protective tape held, from its back side, by a ring-shaped frame via a supporting adhesive tape, the apparatus comprising:

holding means for holding the semiconductor wafer held by the ring-shaped frame with a protective tape adhesion surface facing downward;

separative adhesive tape supplying means for supplying a separative adhesive tape toward the semiconductor wafer held by the holding means;

separating means for joining the separative adhesive tape to the surface of the protective tape and integrally separating the separative adhesive tape and the protective tape from the surface of the semiconductor wafer by horizontally moving the holding means on which the semiconductor wafer is mounted and held and a joining member for pressing a non-adhesion surface of the separative adhesive tape relative to each other;

dropping means for dropping a liquid material onto an adhesion surface of the separative adhesive tape on a joining start end side on which the separative adhesive tape is joined to the protective tape before the separative adhesive tape is joined; and tape collecting means for collecting the protective tape integrated with the separated separative adhesive tape.

In this configuration, preferably, the dropping means is a nozzle for spraying pure water in a mist state.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

An embodiment of a semiconductor wafer mount apparatus provided with a protective tape separation apparatus of the invention will be described below with reference to the drawings.

Figure 1:
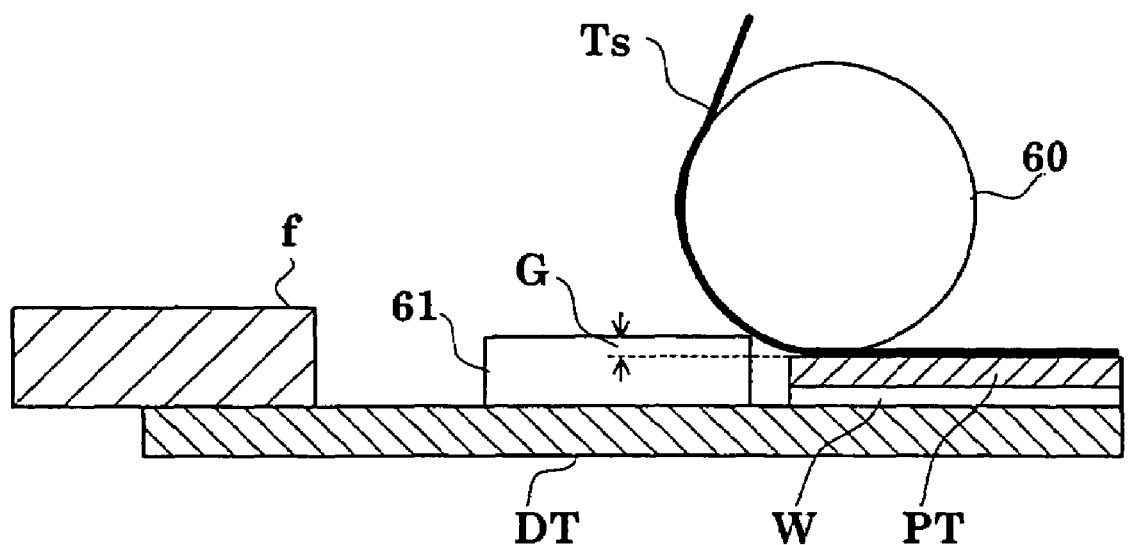
FIG. 1 illustrates an operation state of a roller for joining an adhesive tape of a conventional technique.
Figure 2:
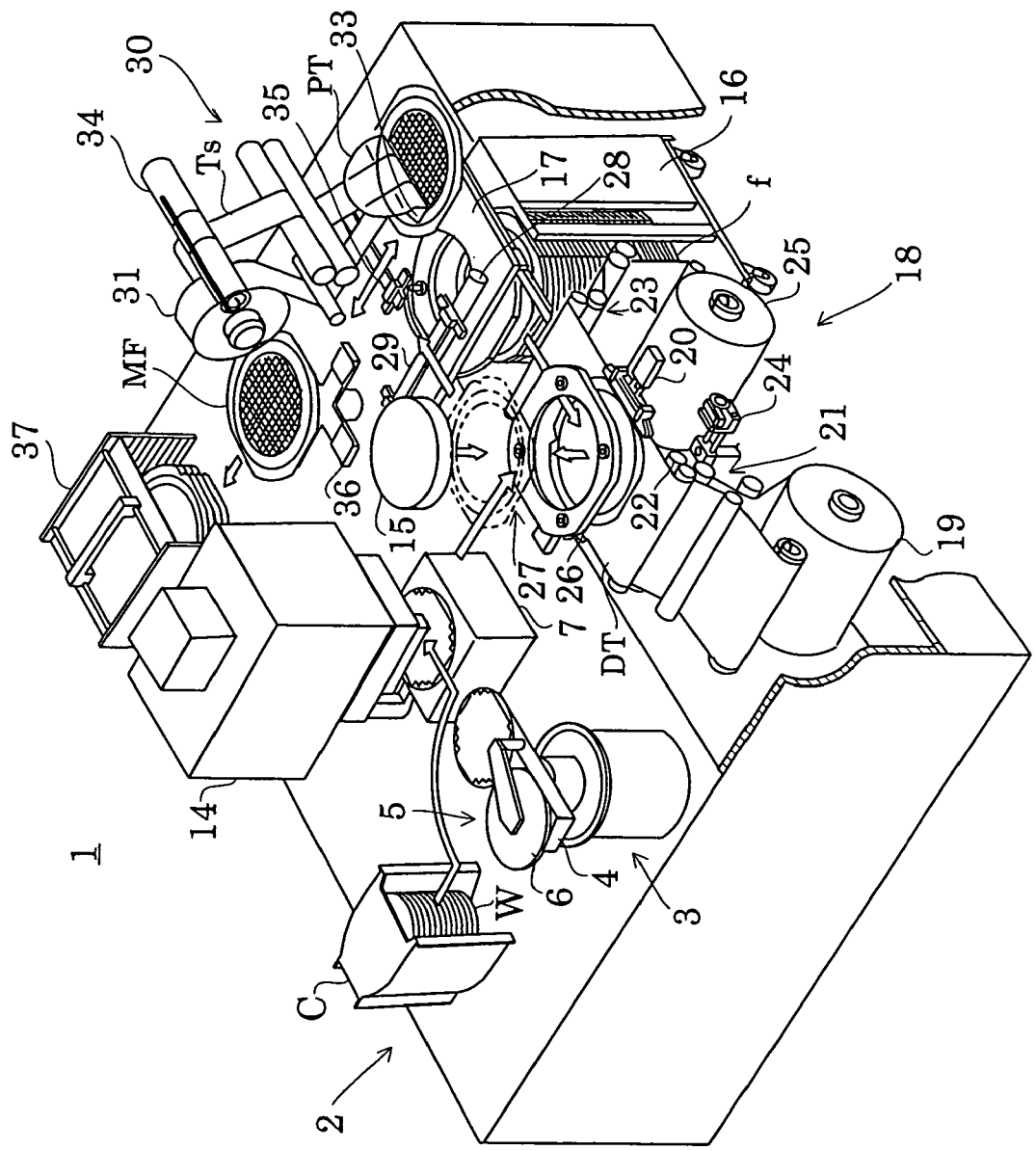
FIG. 2 is a perspective view illustrating a whole semiconductor wafer mount apparatus.

FIG. 2 is a cutaway perspective view illustrating a whole configuration of a semiconductor wafer mount apparatus according to an embodiment of the invention.

A semiconductor wafer mount apparatus 1 includes a wafer supply part 2 in which cassettes C for housing wafers W subjected to a back grinding process in multiple stages are loaded, a wafer transport mechanism 3 having a robot arm 4 and a pressing mechanism 5, an alignment stage 7 for aligning the wafer W, an ultraviolet irradiation unit 14 for emitting ultraviolet rays toward the wafer W mounted on the alignment stage 7, a chuck table 15 for suction-holding the wafer W, a ring frame supply part 16 in which ring-shaped frames (hereinafter, simply referred to as "ring frames f") are housed in multiple stages, a ring frame transport mechanism 17 for transferring the ring frame f onto a dicing tape DT, a tape processing part 18 for joining the dicing tape DT from the back side of the ring frame f, a ring frame elevating mechanism 26 for moving the ring frame f to which the dicing tape DT is joined in the vertical direction, a mount frame fabrication part 27 for fabricating a mount frame MF integrated by joining the wafer W to the ring frame f to which the dicing tape DT is joined, a first mount frame transport mechanism 29 for transporting the fabricated mount frame MF, a separation mechanism 30 for separating the protective tape PT joined to the surface of the wafer W, a second mount frame transport mechanism 35 for transporting the mount frame MF from which the protective tape PT is separated by the separation mechanism 30, a turn table 36 for turning and transporting the mount frame MF, and a mount frame collecting part 37 for housing the mount frames MF in multiple stages.

The wafer supply part 2 has a cassette stand on which the cassettes C housing the wafers W in multiple stages is mounted. The protective tape PT is joined to a pattern surface (hereinafter, appropriately referred to as "surface") of the wafer W. The wafer W maintains a horizontal posture with its pattern surface facing upward.

The wafer transport mechanism 3 is constructed so as to swing and move in the vertical direction by a driving mechanism (not shown). Specifically, the wafer transport mechanism 3 performs position adjustment of a wafer holder of the robot arm 4 which will described later and a pressing plate 6 of the pressing mechanism 5, and transports the wafer W from the cassette C to the alignment stage 7.

The robot arm 4 of the wafer transport mechanism 3 has, at its distal end, a wafer holder (not shown) having a horseshoe shape. The robot arm 4 is constructed so that its wafer holder can move forward/rearward in the gaps between the wafers W housed in multiple stages in the cassettes C.

The wafer holder has a suction hole and holds the wafer W from the back side by vacuum.

The pressing mechanism 5 of the wafer transport mechanism 3 has, at its distal end, the circular pressing plate 6 having almost the same shape as that of the wafer W. The arm portion of the pressing mechanism 5 can move forward/rearward so that the pressing plate 6 is moved above the wafer W mounted on the alignment stage 7. The shape of the pressing plate 6 is not limited to the circular shape but may be any shape as long as a warp which occurs in the wafer W can be corrected. For example, a distal end of a stick or the like may be pressed against a warped portion of the wafer W.

The pressing mechanism 5 operates in the case where poor suction occurs when the wafer W is mounted on a holding table of the alignment stage 7 which will be described later. Concretely, when a warp occurs in the wafer W and the wafer W cannot be suction-held, the pressing plate 6 presses the surface of the wafer W and corrects the warp, so that the surface becomes flat. In this state, a holding table 8 sucks by vacuum the back side of the wafer W.

The alignment stage 7 has a holding table (not shown) for positioning the mounted wafer W on the basis of an orientation flat or the like and covering and sucking by vacuum the whole back side of the wafer W.

The alignment stage 7 detects a pressure value when the waver W is sucked by vacuum. The result of detection is compared with a reference value which is predetermined in relation to a pressure value in normal operation (when the wafer W is normally sucked by the holding table by vacuum). When the pressure value is higher than the reference value (that is, when the pressure in an intake pipe is not sufficiently lowered), it is determined that the wafer W is warped and is not sucked by the holding table by vacuum. The pressing plate 6 is operated to press the wafer W and correct the warp, so that the wafer W is sucked by the holding table by vacuum.

The alignment stage 7 can transport the wafer W in a state where it suction-holds the wafer W between an initial position where the wafer W is mounted and positioned and an intermediate position between the chuck table 15 and the ring frame elevating mechanism 26 disposed in multiple stages above the tape processing part 18 which will be described later. That is, the alignment stage 7 transports the wafer W to the next process while correcting the warp of the wafer W and holding the wafer W in a flat state.

The ultraviolet irradiation unit 14 is positioned above the alignment stage 7 in the initial position. The ultraviolet irradiation unit 14 emits ultraviolet rays toward the protective tape PT as an ultraviolet curing adhesive tape joined to the surface of the wafer W. That is, the adhesion of the protective tape PT is decreased by the irradiation of ultraviolet rays.

The chuck table 15 has a circular shape which is almost the same as that of the wafer W so as to be able to cover and suck by vacuum the surface of the wafer W. A driving mechanism (not shown) moves the chuck table 15 vertically from a standby position above the tape processing part 18 to a position where the wafer W is joined to the ring frame f.

That is, the chuck table 15 comes into contact with the wafer W whose warp is corrected and held in a flat state by the holding table, and suction-holds the wafer W.

The chuck table 15 moves downward to a position where it is fit in an opening of the ring frame elevating mechanism 26 for suction-holding the ring frame f, to which the dicing tape DT to be described later is joined from the back side, and the wafer W comes close to the dicing tape DT in the center of the ring frame f.

At this time, the chuck table 15 and the ring frame elevating mechanism 26 are held by a holding mechanism (not shown).

The ring frame supply part 16 has a wagon shape having a bottom provided with wheels, and is loaded inside the semiconductor wafer mount apparatus 1. The upper part of the ring frame supply part 16 is open in which the ring frames f housed in multiple stages are slid up and fed out.

The ring frame transport mechanism 17 sequentially sucks by vacuum the ring frames f housed in the ring frame supply part 16 from the top one by one, and transports the ring frame f in the order of the alignment stage (not shown) and a position where the dicing tape DT is joined. The ring frame transport mechanism 17 also acts as a holding mechanism which holds the ring frame f in the position of joining the dicing tape DT at the time of joining the dicing tape DT.

The tape processing part 18 includes a tape supply part 19 for supplying the dicing tape DT, a pair of right and left tension mechanisms 20 for tensioning the dicing tape DT, a joining unit 21 for joining the dicing tape DT to the ring frame f, a cutter mechanism 24 for cutting the dicing tape DT joined to the ring frame f, a separation unit 23 for separating an unnecessary tape from the ring frame f after the cutting by the cutter mechanism 24, and a tape collecting part 25 for collecting the cut unnecessary remaining tape.

The tension mechanism 20 catches both ends of the dicing tape DT in the width direction and applies tension in the tape width direction. Specifically, when the soft dicing tape DT is used, vertical wrinkles generate in the surface of the dicing tape DT along the tape supply direction due to tension applied in the tape supply direction. In order to uniformly join the dicing tape DT to the ring frame f while avoiding the vertical wrinkles, tension is applied in the tape width direction.

The joining unit 21 is disposed in the standby position obliquely below (lower left in FIG. 2) the ring frame f held above the dicing tape DT. A joining roller 22 provided in the joining unit 21 moves to the joining start position on the right side in the tape supply direction at the same time when the ring frame f is transported from the ring frame transport mechanism 17 and held in the position where the dicing tape DT is joined and supply of the dicing tape DT from the tape supply part 19 starts.

The joining roller 22 arrived at the joining start position moves upward and presses the dicing tape DT against the ring frame f. After that, the joining roller 22 rolls from the joining start position toward the standby position and joins the dicing tape DT to the ring frame f while pressing the dicing tape DT.

The separation unit 23 separates an unnecessary portion of the dicing tape DT cut by the cutter mechanism 24 which will be described later from the ring frame f. Concretely, after the dicing tape DT is joined to the ring frame f and is cut, the holding of the dicing tape DT by the tension mechanism 20 is cancelled. The separation unit 23 moves toward the tape supply part 19 over the ring frame f to separate the cut unnecessary dicing tape DT.

The cutter mechanism 24 is disposed below the dicing tape DT on which the ring frame f is mounted. When the dicing tape DT is joined to the ring frame f by the joining unit 21, the holding of the dicing tape DT by the tension mechanism 20 is cancelled, and the cutter mechanism 24 moves upward. The cutter mechanism 24 moved upward cuts the dicing tape DT along the ring frame f.

The ring frame elevating mechanism 26 is in a standby position above the position where the dicing tape DT is joined to the ring frame f. The ring frame elevating mechanism 26 moves downward when the process of joining the dicing tape DP to the ring frame f is finished, and suction-holds the ring frame f. At this time, the ring frame transport mechanism 17 which has held the ring frame f returns to the initial position above the ring frame supply part 16.

The ring frame elevating mechanism 26 suction-holds the ring frame f and moves upward to the position where the wafer W is joined to the ring frame f. At this time, the chuck table 15 that suction-holds the wafer W moves downward to the position where the wafer W is joined to the ring frame f.

The mount frame fabrication part 27 includes a joining roller 28. The joining roller 28 rolls while pressing a non-adhesion surface of the dicing tape DT joined to the back side of the ring frame f. The joining roller 28 is made of a soft material such as rubber or resin.

The first mount frame transport mechanism 29 sucks by vacuum a mount frame MF formed by integrating the ring frame f and the wafer W, and transfers the mount frame MF to a separation table (not shown) of the separation mechanism 30.

Figure 3:
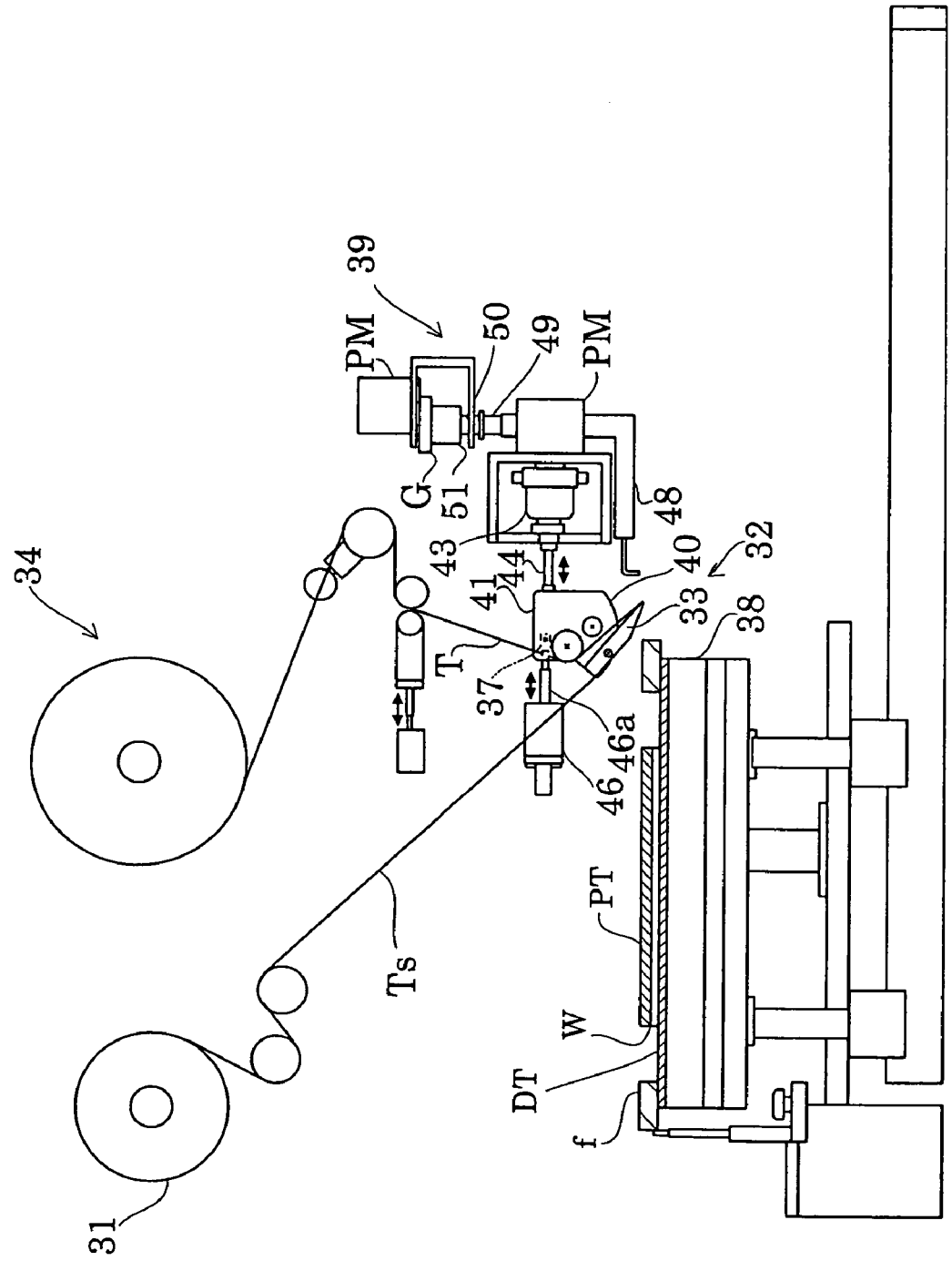
FIG. 3 is a side view illustrating a whole separation mechanism.

As shown in FIG. 3, the separation mechanism 30 includes a separation table 38 on which the wafer W is mounted and which moves the wafer W, a tape supply part 31 for supplying the separation tape Ts, a separation unit 32 for joining and separating the separation tape Ts, a dropping mechanism 39 for dropping pure water onto an adhesion surface of the dicing tape DT on the joining start end side to which the separation tape Ts is joined, and a tape collecting part 34 for collecting the separated separation tape Ts and the protective tape PT.

The configuration except for the separation table 38 in the separation mechanism 30 is provided on an entire surface (not shown) of the semiconductor wafer mount apparatus 1. The separation table 38 corresponds to holding means of the invention, the tape supply part 31 corresponds to separative adhesive supplying means, the separation unit 32 corresponds to separating means, the dropping mechanism 39 corresponds to dropping means, and the separation tape Ts corresponds to a separative adhesive tape.

The separation table 38 is made of a porous material and sucks the mount frame MF from the back side by vacuum. A movable stand, supported so as to be slidable in the horizontal direction along a pair of front/rear rails, of the separation table 38 is held by rails of the semiconductor wafer mount apparatus body and is interlocked via a driving part such as a motor (not shown).

The tape supply part 31 supplies the separation tape Ts led from the separation tape roller and passing above the separation table.

Figure 4:
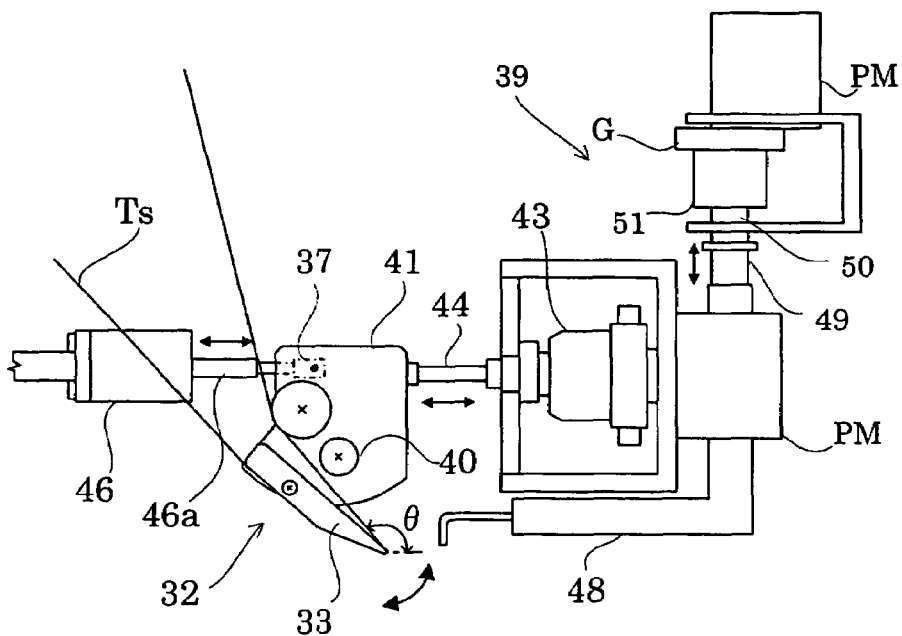
FIG. 4 is a side view illustrating the configuration of a main part of the separation mechanism.
Figure 5:
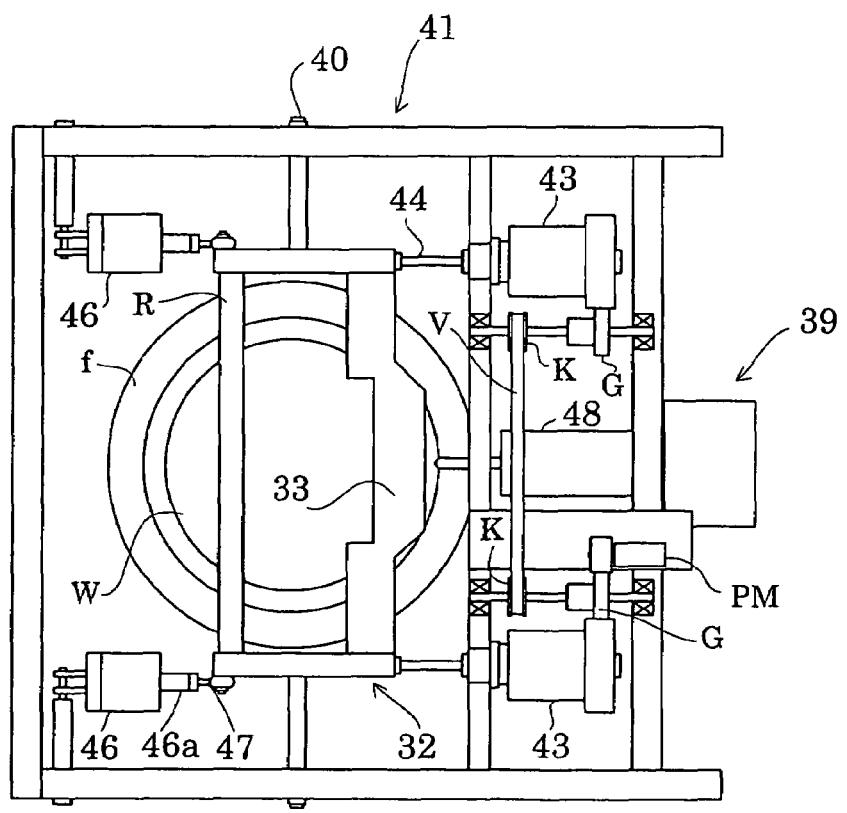
FIG. 5 is a plan view illustrating the configuration of the main part of the separation mechanism.

As shown in FIGS. 4 and 5, the separation unit 32 includes an edge member 33, which has a sharp distal end, for separating a tape. The edge member 33 is constituted by a plate member which is wider than the diameter of the wafer, and the separation unit 32 is swingably attached to an edge unit 41 axially supported by a rotary shaft 40. A separation tape transporting roller R is also attached.

A connecting rod 47 of an air cylinder 46 is coupled to a side of the edge unit 41 via a piston rod 46a, and the edge unit 41 is swung forward and rearward in the travel direction of the edge member 33 in accordance with in-and-out operation of the piston rod 46a, thereby enabling the distal end of the edge of the edge member 33 to move in the vertical direction, that is, enabling the height to be changed and enabling the angle to be also changed.

On the side opposite to the air cylinder 46, two micrometers 43 to which rotation of a pulse motor PM is transmitted and from/in which an adjustment shaft 44 projects/contracts in accordance with forward/reverse rotations of the pulse motor PM are attached on the right and left sides of the edge unit 41.

Specifically, the two micrometers 43 have the structure in which rotations of the same rotation speed are transmitted from the single pulse motor PM to the two micrometers 43 via a belt V looped over pulleys K coaxially attached to gears G. The rotation of the pulse motor PM is directly transmitted to one of the gears G and is transmitted to the micrometer 43. The rotation is transmitted indirectly via the belt V to the other gear G and is transmitted to the micrometer 43. The adjustment axes 44 of the right and left micrometers 44 project and contract in the same scale.

The distal end of the adjustment axis 44 of the micrometer 43 comes into contact with a side of the frame of the edge unit 41. That is, the edge unit 41 to which a tilt angle is given by the piston rod 46a so that the edge has a predetermined angle comes into contact with the frame of the edge unit 41 and functions as a stopper so that the edge unit 41 does not incline more than the given tilt angle and the position of the edge does not move in the height direction, particularly, downward.

The dropping mechanism 39 is disposed so that the distal end of an L-shaped piston nozzle 48 faces downward at a predetermined interval from the edge member 33. From the piston nozzle 48, pure water WA stored on the inside is dropped by a predetermined amount when a piston rod 49 is pressed. On the side facing the piston rod 49, a micrometer 51 to which rotation of the pulse motor PM is transmitted and from/in which an adjustment axis 50 projects/contracts in accordance with forward/reverse rotations of the pulse motor PM is attached.

The micrometer 51 has a structure that rotations of the same rotation speed are transmitted thereto from the pulse motor PM via the gear G. That is, the rotation of the pulse motor PM is directly transmitted to the gear G and is transmitted to the micrometer 51. The adjustment axis 50 of the micrometer 51 projects and contracts in a predetermined scale, thereby pressing the piston rod 49. That is, a predetermined amount of the pure water WA is dropped in front of the edge member 33, that is, dropped onto an adhesion surface of the dicing tape DT on the joining start end side of the separation tape Ts.

Referring again to FIG. 2, the second mount frame transport mechanism 35 sucks by vacuum the mount frame MF ejected from the separation mechanism 30, and transfers it to the turn table 36.

The turn table 36 positions the mount frame MF and houses the mount frame MF into the mount frame collecting part 37. To be specific, when the mount frame MF is mounted on the turn table 36 by the second mount frame transport mechanism 35, the mount frame MF is positioned on the basis of the orientation flat of the wafer W, the positioning shape of the ring frame f, and the like. After completion of positioning of the mount frame MF, in order to change the direction of housing the mount frame MF to the mount frame collecting part 37, the turn table 36 turns. When the housing direction is determined, the turn table 37 pushes the mount frame MF by a pusher (not shown) to house the mount frame MF into the mount frame collecting part 37.

The mount frame collecting part 37 is mounted on an elevatable mount table (not shown). By the vertical movement of the mount table, the mount frame MF pushed by the pusher can be housed in an arbitrary stage in the mount frame collecting part 37.

A series of operations of the semiconductor wafer mount apparatus of this embodiment will now be described with reference to FIGS. 2 to 8.

The wafer holder of the robot arm 4 is inserted in the gap between the cassettes C. The wafer W is suction-held from below and ejected one by one. The ejected wafer W is transported to the alignment stage 7.

The wafer W is mounted on the holding table 8 by the robot arm 4 and suction-held from the back side. At this time, the suction level of the wafer W is detected by a manometer (not shown) and is compared with a reference value which is predetermined in relation with a pressure value in normal operation.

When abnormality of suction is detected, the pressing plate 6 is pressed against the surface of the wafer W, and the wafer W is suction-held in a flat state obtained by correcting the warp. The wafer W is positioned on the basis of an orientation flat or a notch.

After completion of positioning on the alignment stage 7, the surface of the wafer W is irradiated with ultraviolet rays by the ultraviolet irradiation unit 14.

The wafer W subjected to the ultraviolet irradiating process is transported to the next mount frame fabrication part 27 while being suction-held by the holding table 8 on the alignment stage 7. The alignment stage 7 moves to an intermediate position between the chuck table 15 and the ring frame elevating mechanism 26.

When the alignment stage 7 waits in a predetermined position, the chuck table 15 positioned above moves downward, the bottom face of the chuck table 15 comes into contact with the wafer W, and the chuck table 15 starts sucking the wafer W by vacuum. When the vacuum-suction of the chuck table 15 starts, the suction-holding on the holding table 8 side is canceled, and the wafer W is received by the chuck table 15 in a flat state where the warp is corrected. The alignment stage 7 which has delivered the wafer W returns to the initial position.

The ring frames f housed in multiple stages in the ring frame supply part 16 are sucked by vacuum and ejected one by one from the top by the ring frame transport mechanism 17. The ejected ring frame f is positioned on an alignment stage (not shown) and, after that, is transported to the dicing tape DT joining position above the dicing tape DT.

When the ring frame f is held by the ring frame transport mechanism 17 and is in the dicing tape DT joining position, supply of the dicing tape DT from the tape supply part 19 starts. Simultaneously, the joining roller 22 moves to the joining start position.

When the joining roller 22 arrives at the joining start position, the tension mechanism 20 holds both ends in the width direction of the dicing tape DT and applies tension in the tape width direction.

Next, the joining roller 22 moves upward to press the dicing tape DT against the end of the ring frame f and join it. After joining the dicing tape DT to the end of the ring frame f, the joining roller 22 rolls toward the tape supply part 19 side as the standby position. At this time, the joining roller 22 rolls while pushing the dicing tape DT (non-adhesion surface) to thereby join the dicing tape DT to the ring frame f. When the joining roller 22 reaches the terminating end of the joining position, holding of the dicing tape DT by the tension mechanism 20 is cancelled.

Simultaneously, the cutter mechanism 24 moves upward to cut the dicing tape DT along the ring frame f. After completion of cutting of the dicing tape DT, the separation unit 23 moves toward the tape supply part 19 and separates the unnecessary dicing tape DT.

After that, the tape supply part 19 operates to feed the dicing tape DT and the unnecessary portion of the cut tape is sent to the tape collecting part 25. At this time, the joining roller 22 moves to the joining start position so as to join the dicing tape DT to the next ring frame f.

The frame portion of the ring frame f to which the dicing tape DT is joined is suction-held by the ring frame elevating mechanism 26 and is moved upward. At this time, the chuck table 15 also moves downward. That is, the chuck table 15 and the ring frame elevating mechanism 26 move to the position where the wafer W is joined.

The mechanisms 15 and 26 arrive at predetermined positions and are held by holding mechanisms (not shown). Next, the joining roller 28 moves to the joining start position of the dicing tape DT, and rolls while pressing the non-adhesion surface of the dicing tape DT joined to the bottom face of the ring frame f, thereby joining the dicing tape DT to the wafer W. As a result, the mount frame MF obtained by integrating the ring frame f and the wafer W is fabricated.

After the wafer W is fabricated, the chuck table 15 and the ring frame elevating mechanism 26 move upward. At this time, a holding table (not shown) moves to a position below the mount frame MF, and the mount frame MF is mounted on the holding table. The mounted mount frame MF is suction-held by the first mount frame transport mechanism 29 and transferred onto the separation table 38.

Figure 6:
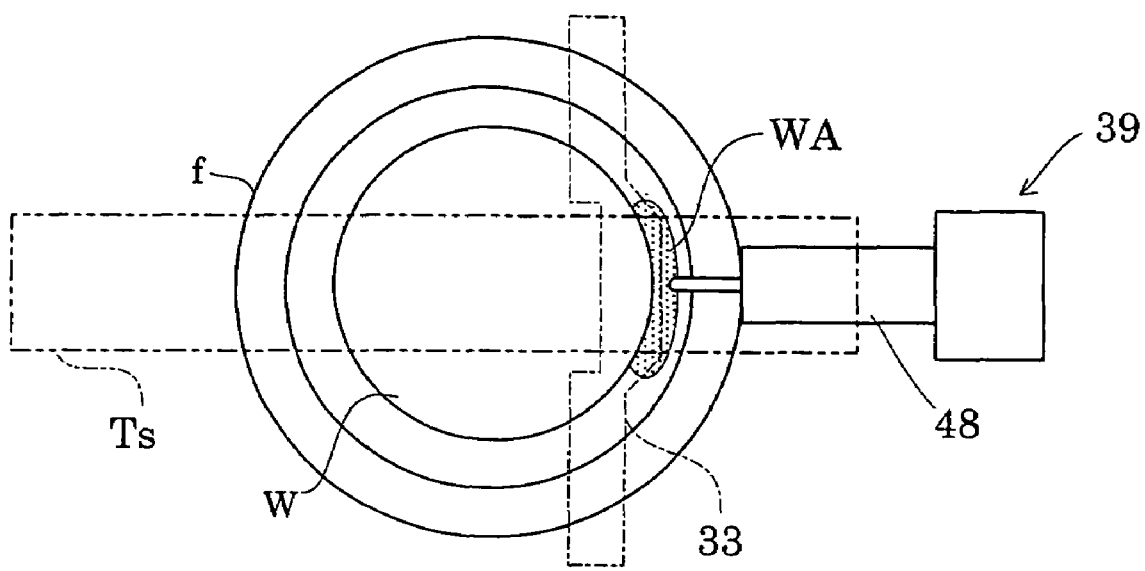
FIG. 6 illustrates a state where pure water drops.
Figure 7:
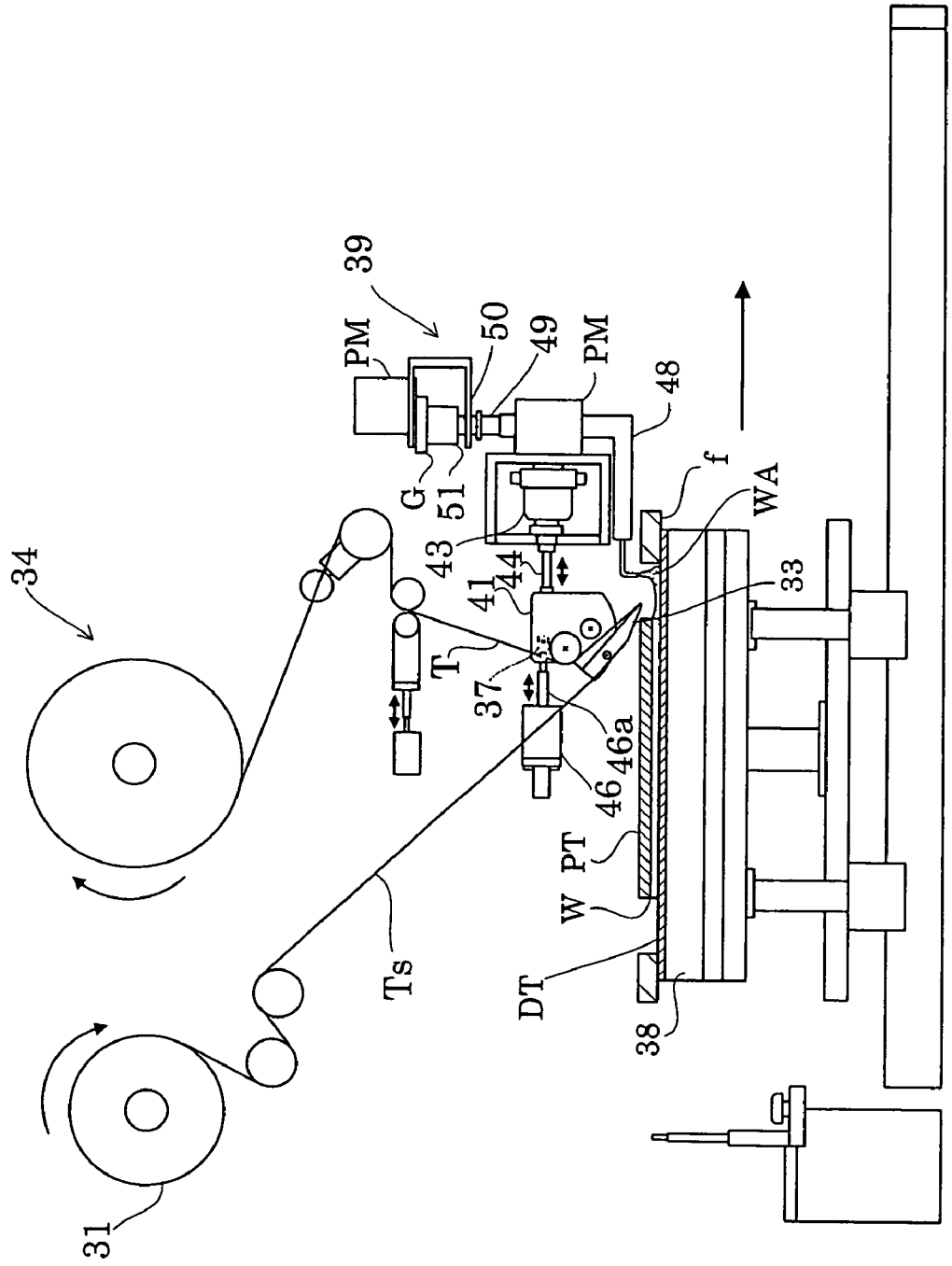
FIG. 7 illustrates operations of the separation mechanism.

The separation table 38 on which the mount frame MF is mounted moves to a position below the separation unit 32 as shown in FIG. 7. When the mount frame MF reaches a predetermined position below the separation unit 32, the separation table 38 temporarily stops. Then, the dropping mechanism 39 operates to drop the pure water WA from the piston nozzle 48 onto the adhesion surface of the dicing tape DT on the joining start end side of the separation tape Ts so that the pure water WA spreads wider than the width of the dicing tape DT as shown in FIG. 6.

After that, the edge member 33 moves downward to a predetermined level in a state where the separation tape Ts supplied from the tape supply part 31 runs. Since the pure water WA is dropped onto the position at the joining start end where the edge member 33 moves downward, the separation tape Ts and the dicing tape DT do not come into contact with each other. The separation table 38 starts moving again in a state where the edge member 33 moves downward. With this movement, the edge member 33 joins the separation tape Ts to the protective tape PT on the surface of the wafer W while pressing the separation tape Ts against the protective tape PT. At the same time with joining of the separation tape Ts, the edge member 33 separates the joined separation tape Ts together with the protective tape PT from the surface of the wafer W.

Figure 8:
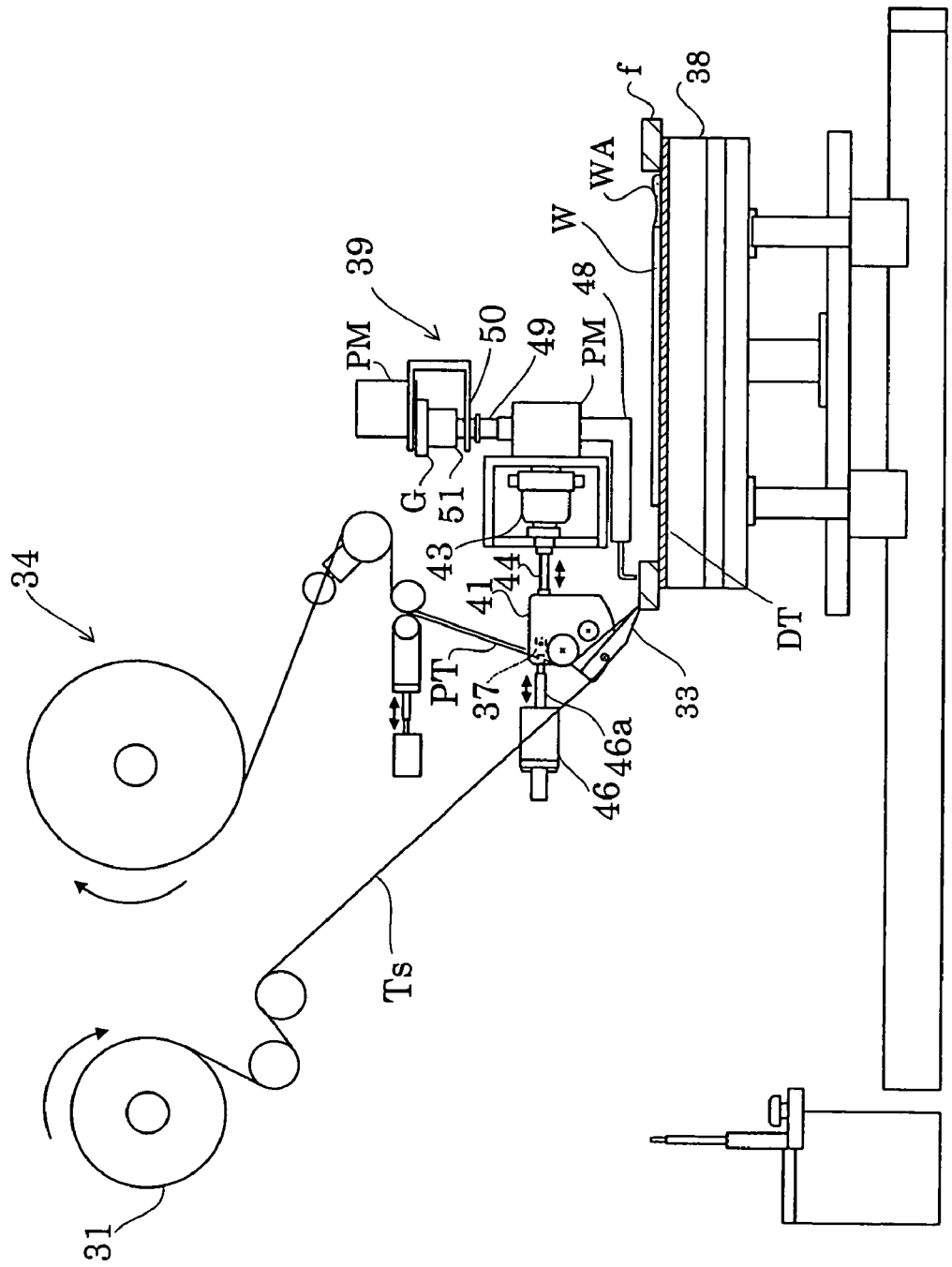
FIG. 8 illustrates operations of the separation mechanism.

When the separation table 38 reaches the protective tape joining terminating end position as shown in FIG. 8, the edge member 38 moves upward and the separation unit 32 returns to the initial position.

The mount frame MF subjected to the process of separating the protective tape PT is moved to the standby position of the second mount frame transport mechanism 35 by the separation table 38.

The mount frame MF ejected from the separation mechanism 30 is transferred onto the turn table 36 by the second mount frame transport mechanism 35. The transferred mount frame MF is positioned on the basis of the orientation flat or notch, and its housing direction is adjusted. After completion of the positioning and adjustment of the housing direction, the mount frame MF is pushed by the pusher and housed into the mount frame collecting part 37.

The series of the operations of the semiconductor wafer mount apparatus 1 of this embodiment are finished. In the semiconductor wafer mount apparatus, the movement amount, the stop position, and the timings of the separation table 38, vertical movement and its timing of the edge member 33, the drop amount of pure wafer from the piston nozzle 48 of the dropping mechanism 39, and the like are preset in a controller (not shown). On the basis of the set conditions, the controller controls the components in a centralized manner.

As described above, before the separation tape Ts is joined to the surface of the wafer W held by the ring frame f, the pure water WA is dropped onto the adhesion surface of the back side of the dicing tape DT on the joining start end side so that the pure water WA spreads wider than the separation tape Ts and to the end of the wafer W. With this operation, even when the edge member 33 moves downward on the joining start end side at the time of joining the separation tape Ts, the separation tape Ts that is run on the edge member 33 does not come into direct contact with the back side of the dicing tape Dt. That is, the separation tape Ts can be joined to the surface of the protective tape PT from the joining start end at the end of the wafer with a predetermined press force without contact between the dicing tape DT and the separation tape Ts. As a result, deterioration in separating precision of the protective tape PT, which occurs due to uneven joining of the separation tape Ts can be prevented.

Since the pure water WA is used as a liquid material dropped onto the back side of the dicing tape CT, the pure water WA can be dried naturally in a process of transporting the mount frame MF from which the protective tape has been separated to the subsequent process. Even if the pure water remains in the dicing process of the subsequent process, since pure water is used at the time of dicing, no adverse influence is exerted.

The invention is not limited to the foregoing embodiment but can be modified as follows.

(1) Although the edge member 33 is used to join the separation tape Ts in the foregoing embodiment, a roller may be used instead thereof (2) Although the separation table 38 is temporarily stopped at the time of dropping pure water from the piston nozzle 48, the travel speed of the separation table 38 may be adjusted by the controller so as not to stop the separation table 38.

(3) Although pure water is used as a liquid material in the foregoing embodiment, any liquid material such as alcohol or oil may be used as long as it can avoid contact between the dicing tape DT and the separation tape Ts.

(4) Although pure water is dropped to the dicing tape DT side in the foregoing embodiment, in the case of inverting the mount frame MF and separating the protective tape from below, the liquid material may be dropped onto the separation tape Ts side. In this case, it is sufficient to interchange the upper and lower parts of the separation mechanism 30 shown in FIG. 3 and direct the tip of the piston nozzle 48 toward the adhesion surface of the separation tape Ts. As the liquid to be dropped, a liquid material having viscosity capable of maintaining a stationary state on the adhesion surface of the separation tape Ts or a liquid material constituted by fine particles obtained by, for example, forming mists from pure water or alcohol can be used.

(5) Although the holding table 38 is moved at the time of joining the adhesive tape Ts in the foregoing embodiment, the edge member 33 and the dropping mechanism 39 may be moved in a state where the separation table 38 is fixed. Alternatively, a set of the edge member 33 and the dropping mechanism 39 and the separation table 38 may be simultaneously moved in opposite directions.

(6) Although the dropping mechanism 39 is formed integrally with the separation unit 32 in the foregoing embodiment, the separation unit 32 and the dropping mechanism 39 may be separate members and move separately.

(7) Although the distal end of the piston nozzle 48 faces just below in the foregoing embodiment, the piston nozzle 48 may be attached in an inclined posture so that the distal end faces the end side of the wafer W.

(8) Although the band-shaped separation tape Ts is joined to separate the protective tape PT in the foregoing embodiment, for example, an adhesive sheet including an adhesive tape, a label, or a plate-shaped sheet, an adhesive sheet including an adhesive tape, a label, or a plate-shaped displaying adhesion when heated, and the like can be used.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for separating a protective tape from a semiconductor wafer with the protective tape held, from its back side, by a ring-shaped frame via a supporting adhesive tape, the apparatus comprising:

holding means for mounting and holding thereon the semiconductor wafer held by the ring-shaped frame;

separative adhesive tape supplying means for supplying a separative adhesive tape toward the semiconductor wafer held by the holding means;

separating means for joining the separative adhesive tape to the surface of the protective tape and integrally separating the separative adhesive tape and the protective tape from the surface of the semiconductor wafer by horizontally moving the holding means on which the semiconductor wafer is mounted and held and a joining member for pressing a non-adhesion surface of the separative adhesive tape relative to each other;

dropping means for dropping a liquid material onto an adhesion surface of the supporting adhesive tape on a joining start end side of the separative adhesive tape before the separative adhesive tape is joined; and tape collecting means for collecting the protective tape integrated with the separated separative adhesive tape.

2. The apparatus of claim 1, wherein
the dropping means is disposed at a predetermined interval to the front side in the travel direction of the joining member and moves integrally with the joining member horizontally relative to the holding means.

3. The apparatus of claim 1, wherein
the dropping means is a nozzle.

4. The apparatus of claim 1, wherein
the joining member is an edge member.

5. The apparatus of claim 1, wherein
the joining member is a roller.

6. An apparatus for separating a protective tape from a semiconductor wafer with the protective tape held, from its back side, by a ring-shaped frame via a supporting adhesive tape, the apparatus comprising:

holding means for holding the semiconductor wafer held by the ring-shaped frame with a protective tape adhesion surface facing downward;

separative adhesive tape supplying means for supplying a separative adhesive tape toward the semiconductor wafer held by the holding means;

separating means for joining the separative adhesive tape to the surface of the protective tape and integrally separating the separative adhesive tape and the protective tape from the surface of the semiconductor wafer by horizontally moving the holding means on which the semiconductor wafer is mounted and held and a joining member for pressing a non-adhesion surface of the separative adhesive tape relative to each other;

dropping means for dropping a liquid material onto an adhesion surface of the separative adhesive tape on a joining start end side on which the separative adhesive tape is joined to the protective tape before the separative adhesive tape is joined; and tape collecting means for collecting the protective tape integrated with the separated separative adhesive tape.

7. The apparatus of claim 6, wherein
the dropping means is a nozzle for spraying pure water in a mist state.

* * * * *